US012701831B2

(12) United States Patent
Bilenko et al.

(10) Patent No.: US 12,701,831 B2
(45) Date of Patent: Aug. 4, 2026

(54) LIGHT EMITTING DIODE PACKAGE AND LIGHT EMITTING APPARATUS COMPRISING THE SAME

(71) Applicant: SEOUL VIOSYS CO., LTD., Gyeonggi-do (KR)

(72) Inventors: Yuriy Bilenko, Gyeonggi-do (KR); Ki Yon Park, Gyeonggi-do (KR)

(73) Assignee: Seoul Viosys Co., Ltd., Gyeonggi-do (KR)

( * ) Notice: Subject to any disclaimer, the term of this patent is extended or adjusted under 35 U.S.C. 154(b) by 670 days.

(21) Appl. No.: 17/119,136

(22) Filed: Dec. 11, 2020

(65) Prior Publication Data

US 2021/0098654 A1 Apr. 1, 2021

Related U.S. Application Data

(63) Continuation of application No. PCT/KR2019/007000, filed on Jun. 11, 2019.

(30) Foreign Application Priority Data

Jun. 11, 2018 (KR) ........................ 10-2018-0066557

(51) Int. Cl.
*H10H 20/85* (2025.01)
*H10H 20/855* (2025.01)
*H10H 20/01* (2025.01)

(52) U.S. Cl.
CPC ...... *H10H 20/8506* (2025.01); *H10H 20/855* (2025.01); *H10H 20/036* (2025.01)

(58) Field of Classification Search
CPC ....... H01L 33/58; H01L 33/48; H01L 33/483; H01L 33/486; H01L 25/13; H01L 33/62;
(Continued)

(56) References Cited

U.S. PATENT DOCUMENTS

| | | | |
|---|---|---|---|
| 2001/0001252 A1 | 5/2001 | Umetsu | |
| 2007/0241357 A1* | 10/2007 | Yan | ........................ H01L 33/58 257/E33.001 |

(Continued)

FOREIGN PATENT DOCUMENTS

| | | |
|---|---|---|
| CN | 101060158 A | 10/2007 |
| CN | 104124237 A | 10/2014 |

(Continued)

OTHER PUBLICATIONS

Examination Report issued in corresponding IN Application No. 202138061797, issued Jul. 29, 2022, 6 pages.

(Continued)

*Primary Examiner* — Lauren R Bell
(74) *Attorney, Agent, or Firm* — LaBatt, LLC

(57) ABSTRACT

A light emitting diode package includes a main frame including a base frame and a middle frame disposed on the base frame, a holding frame disposed on the middle frame, a light emitting diode chip disposed on the base frame, and a window secured by the main frame and the holding frame. The middle frame includes a middle frame open portion exposing the light emitting diode chip. The holding frame includes a holding frame open portion at least partially overlapping with the middle frame open portion on a plane. The holding frame open portion has an area decreasing in a direction away from the main frame.

16 Claims, 7 Drawing Sheets

(58) Field of Classification Search
CPC .. H10H 20/855; H10H 20/85; H10H 20/8505; H10H 20/8502; H10H 29/855; H10H 29/85; H10H 29/8505; H10H 29/8502; H10H 20/8508; H10H 29/8508; H10H 20/857; H10H 29/857; H10W 90/00
See application file for complete search history.

(56) References Cited

U.S. PATENT DOCUMENTS

| | | | |
|---|---|---|---|
| 2007/0246728 A1 | 10/2007 | Kim et al. | |
| 2008/0061314 A1* | 3/2008 | Liaw | H01L 33/60 |
| | | | 257/E33.072 |
| 2008/0062698 A1 | 3/2008 | Tai et al. | |
| 2009/0251902 A1* | 10/2009 | Woo | H01L 33/486 |
| | | | 362/296.01 |
| 2012/0126267 A1 | 5/2012 | Jung | |
| 2015/0036046 A1* | 2/2015 | Rudmann | G02B 5/22 |
| | | | 348/374 |
| 2016/0293585 A1 | 10/2016 | Geiger | |
| 2017/0114253 A1 | 4/2017 | Nakayama et al. | |
| 2018/0040789 A1 | 2/2018 | Kim | |
| 2019/0189859 A1* | 6/2019 | Riviere | H01L 31/162 |

FOREIGN PATENT DOCUMENTS

| | | | |
|---|---|---|---|
| CN | 204927346 | U | 12/2015 |
| CN | 107431116 | A | 12/2017 |
| EP | 2472294 | A1 | 7/2012 |
| EP | 2863246 | A1 | 4/2015 |
| EP | 3072155 | A1 | 9/2016 |
| JP | 08-300732 | | 11/1996 |
| JP | 2004-013103 | | 1/2004 |
| JP | 2006-245032 | | 9/2006 |
| JP | 2006-303526 | | 11/2006 |
| JP | 3132536 | U | 6/2007 |
| JP | 2015-220332 | | 12/2015 |
| KR | 10-0700883 | | 3/2007 |
| KR | 10-2012-0056068 | | 6/2012 |
| KR | 20120056068 | A | 6/2012 |
| KR | 10-2013-0070986 | | 6/2013 |
| KR | 10-2016-0088912 | | 7/2016 |
| KR | 20170033292 | A | 3/2017 |
| WO | 2015076750 | A1 | 5/2015 |
| WO | 2016/042819 | | 3/2016 |

OTHER PUBLICATIONS

Office action for Japanese Patent Application No. 2020-569101, Mar. 7, 2023, 8 pages (with English translation).

Extended European Search Report issued in corresponding EP Application No. 19818577.9, issued May 6, 2022, 5 pages.

Office action for Korean Patent Application No. 10-2018-0066557, Oct. 18, 2022, 3 pages (no English translation available).

International Search Report for International Application PCT/KR2019/007000, mailed Sep. 16, 2019.

Office action for Chinese Patent Application No. 201911378066.3 with English translation, Aug. 22, 2023, 14 pages.

Office action for Indian Patent Application No. 202138061797, Sep. 17, 2025, 3 pages (with English translation).

* cited by examiner

LIGHT EMITTING DIODE PACKAGE AND LIGHT EMITTING APPARATUS COMPRISING THE SAME

CROSS-REFERENCE TO RELATED APPLICATIONS AND PRIORITY

The present application is a continuation of International Application No. PCT/KR2019/007000, filed on Jun. 11, 2019, which claims priority to and the benefit of Korean Patent Application No. 10-2018-0066557, filed on Jun. 11, 2018, the disclosures of which are incorporated herein in their entirety.

TECHNICAL FIELD

Embodiments of the present disclosure relate to a light emitting diode package and a light emitting apparatus including the same.

BACKGROUND

In manufacture of a sterilizing apparatus, a curing apparatus, and the like, improvement in durability is an important issue. For improvement of durability, it is necessary to provide stable and firm packaging of light emitting diode chips provided to the sterilizing apparatus, the curing apparatus, and the like. Here, packaging of the light emitting diode chips refers to protection of the light emitting diode chips by surrounding the light emitting diode chips with a substrate, a frame, a window, and the like.

In recent years, to secure an irradiation angle, intensity increase, and the like, various modifications of a light emitting diode chip and a window have been attempted. There is a need for light emitting diode chip packaging capable of providing a stable structure corresponding to such modification of the light emitting diode chip and the window.

SUMMARY

Embodiments of the present disclosure provide a light emitting diode package, in which a window, a lens, and the like each having a curved surface are stably secured, and a light emitting apparatus.

In accordance with embodiments of the present disclosure, there is provided a light emitting diode package including: a main frame including a base frame and a middle frame disposed on the base frame; a holding frame disposed on the middle frame; a light emitting diode chip disposed on the base frame; and a window secured by the main frame and the holding frame, wherein the middle frame includes a middle frame open portion exposing the light emitting diode chip, and a holding frame open portion at least partially overlapping the middle frame open portion on a plane of the holding frame, and the holding frame open portion has an area gradually decreasing with increasing distance from the main frame.

In at least one variant, the middle frame has a larger area than the holding frame on a plane on which the middle frame adjoins the holding frame.

In another variant, the base frame is integrally formed with the middle frame.

In yet another variant, the holding frame includes a holding frame lower surface on which the holding frame adjoins the middle frame; a holding frame upper surface opposite to the lower surface of the holding frame; and a holding frame beveled surface connecting the holding frame lower surface to the holding frame upper surface; and an angle defined between the holding frame upper surface and the holding frame beveled surface is less than 90 degrees.

In another variant, the holding frame beveled surface includes multiple beveled surfaces having different gradients, and an angle defined between at least one of the beveled surfaces and the holding frame upper surface is less than 90 degrees.

In another variant, the holding frame upper surface has a larger area than the holding frame lower surface.

In another variant, the middle frame includes a middle frame lower surface on which the middle frame adjoins the base frame; and a middle frame upper surface on which the middle frame adjoins the holding frame, and the middle frame open portion has a smaller area on the middle frame lower surface than the middle frame open portion on the middle frame upper surface. The middle frame open portion has a tapered shape from the middle frame upper surface toward the middle frame lower surface.

In another variant, the middle frame may further include a middle frame side surface connecting the middle frame lower surface to the middle frame upper surface, and the middle frame side surface has a parabolic cross-sectional shape at a side thereof constituting the middle frame open portion.

In another variant, the window has a maximum width outside the middle frame open portion, and the maximum width of the window is greater than a width of the middle frame open portion on the middle frame upper surface.

In another variant, the window has an ellipsoid shape or a semi-ellipsoid shape and a major axis of the window is disposed outside the middle frame open portion and has a greater length than the width of the middle frame open portion.

In another variant, the window includes a window lower surface facing the light emitting diode chip; and a window upper surface opposite to the window lower surface, and a distance from a distal end of the window upper surface to the middle frame upper surface is greater than a distance from the middle frame upper surface to a distal end of the window lower surface.

In another variant, the distance from the middle frame upper surface to the distal end of the window lower surface is smaller than a distance from an upper end of the light emitting diode chip to the middle frame upper surface.

In another variant, the light emitting diode package includes: multiple open portions disposed adjacent each other on the same plane; multiple light emitting diode chips disposed on the main frame and exposed through the multiple open portions, respectively; and multiple windows covering the multiple open portions, respectively, wherein the holding frame includes multiple holding frame beveled surfaces securing the multiple windows.

In accordance with embodiments of the present disclosure, there is provided a light emitting diode package including: a main frame including a base frame and a middle frame disposed on the base frame; a holding frame disposed on the middle frame; a light emitting diode chip disposed on the base frame; and a window secured by the main frame and the holding frame, wherein the middle frame includes a middle frame open portion exposing the light emitting diode chip; the holding frame includes a holding frame beveled surface adjoining the window; the holding frame beveled surface is inclined towards the light emitting diode chip from a plane on which the middle frame adjoins the holding frame in a direction away from the middle frame; and the middle frame has a larger area than the holding frame on the plane on which the middle frame adjoins the holding frame.

In one embodiment, the holding frame includes a holding frame open portion at least partially overlapping the middle frame open portion on a plane thereof and the holding frame open portion has an area gradually decreasing with increasing distance from the main frame.

In one embodiment, the holding frame includes a holding frame lower surface on which the holding frame adjoins the middle frame; and a holding frame upper surface opposite to the lower surface of the holding frame, the holding frame beveled surface connects the holding frame lower surface to the holding frame upper surface, and an angle defined between the holding frame upper surface and the holding frame beveled surface is less than 90 degrees.

In at least one variant, the middle frame includes a middle frame lower surface on which the middle frame adjoins the base frame; and a middle frame upper surface on which the middle frame adjoins the holding frame, and the middle frame open portion has a smaller area on the middle frame lower surface than the middle frame open portion on the middle frame upper surface.

In accordance with embodiments of the present disclosure, there is provided a light emitting apparatus including: at least one light emitting diode package; and a body on which the at least one light emitting diode package is mounted, the light emitting diode package including: a main frame including a base frame and a middle frame disposed on the base frame; a holding frame disposed on the middle frame; a light emitting diode chip disposed on the base frame; and a window secured by the main frame and the holding frame, wherein the middle frame includes a middle frame open portion exposing the light emitting diode chip; the holding frame includes a holding frame beveled surface adjoining the window; the holding frame beveled surface is inclined towards the light emitting diode chip from a plane on which the middle frame adjoins the holding frame in a direction away from the middle frame, and the middle frame has a larger area than the holding frame on the plane on which the middle frame adjoins the holding frame.

In at least one variant, the holding frame includes a holding frame open portion at least partially overlapping the middle frame open portion on a plane thereof and the holding frame open portion has an area gradually decreasing with increasing distance from the main frame.

In accordance with embodiments of the present disclosure, there is provided a method of manufacturing a light emitting diode package, including: providing a middle frame including a base substrate and multiple middle frame open portions exposing at least part of the base substrate; mounting multiple light emitting diode chips on the base substrate so as to be exposed through the multiple middle frame open portions; disposing multiple windows on the middle frame to cover the multiple middle frame open portions; disposing a holding frame holding the multiple windows on the middle frame; and providing multiple individual light emitting diode packages by cutting the base substrate along lines between the middle frame open portions.

Embodiments of the present disclosure provide a light emitting diode package, in which a window, a lens, and the like each having a curved surface are stably secured. As a result, it is possible to prevent the window, the lens and the like from being separated from the light emitting diode package due to external impact while improving durability of the entirety of the light emitting diode package.

Furthermore, it is possible to manufacture multiple light emitting diode packages through one process.

DESCRIPTION OF DRAWINGS

FIG. 5A is a sectional view of the light emitting diode package according to the embodiment of the present disclosure.

FIG. 5B is a sectional view of the light emitting diode package having a middle frame open portion having a different shape from a middle frame open portion shown in FIG. 5A.

DETAILED DESCRIPTION OF EMBODIMENTS

Figure 1:
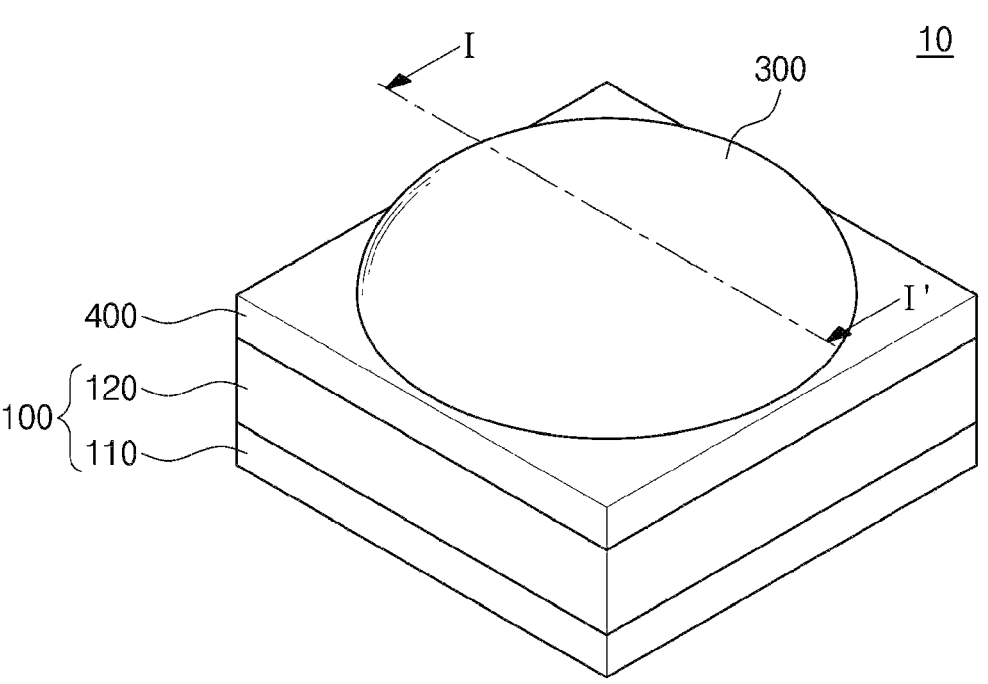
FIG. 1 is a perspective view of a light emitting diode package according to one embodiment of the present disclosure.

The present disclosure may be implemented in various ways and certain embodiments will be described in detail with reference to the accompanying drawings. However, it should be understood that the present disclosure is not limited to the following embodiments and includes all modifications, variations, alterations, and equivalents within the spirit and scope of the present disclosure.

Like elements will be denoted by like reference numerals throughout the specification. In the drawings, widths, lengths, thicknesses, and the like of structures can be exaggerated for clarity and descriptive purposes. Although the terms first, second, and the like may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section in an exemplary embodiment could be termed a second element, component, region, layer, and/or section in another exemplary embodiment. As used herein, the singular forms "a", "an" and "the" are intended to include the plural forms as well, unless the context clearly indicates otherwise.

Herein, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. In addition, when an element, such as a layer, a film, a region, a sheet, and the like, is referred to as being placed "on" another element, it can be directly placed "on" the other element, or intervening element(s) may be present therebetween. Further, when an element, such as a layer, a film, a region, a sheet, and the like, is referred to as being formed "on" another element, the element may be formed not only in an upward direction but also in a lateral or downward direction. On the other hand, when an element, such as a layer, a film, a region, a sheet, and the like, is referred to as being placed "under" another element, it can be directly placed "under" the other element, or intervening element(s) may be present therebetween.

Hereinafter, embodiments of the present disclosure will be described in more detail with reference to the accompanying drawings.

Figure 2:
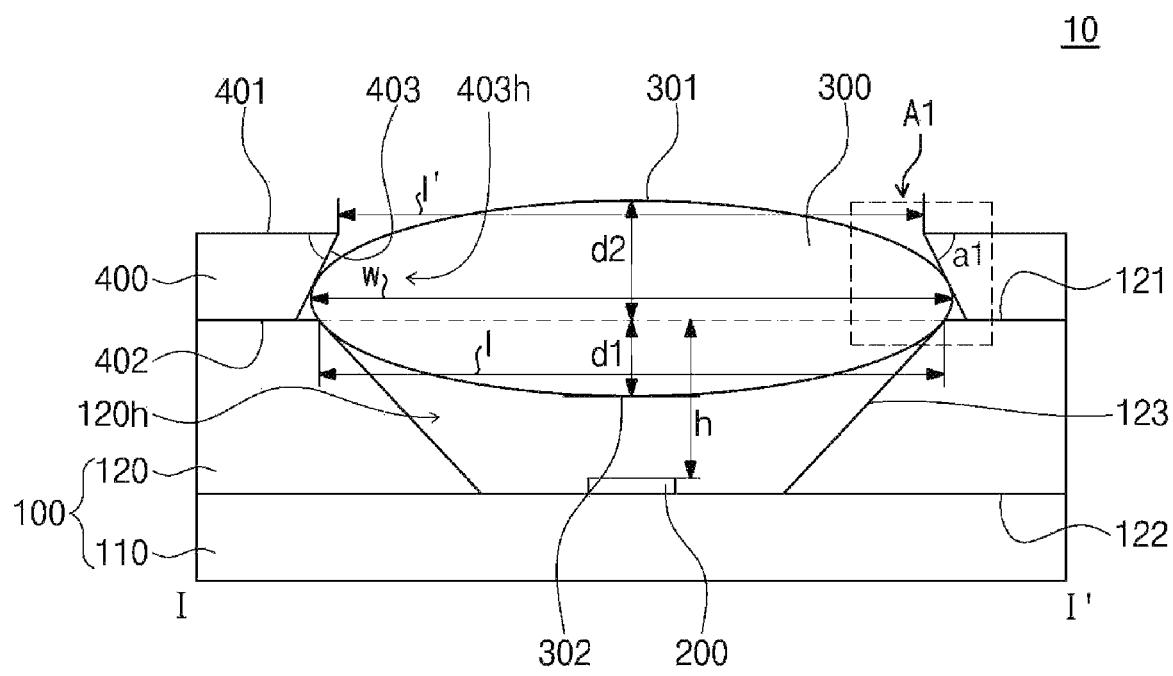
FIG. 2 is a cross-sectional view of the light emitting diode package taken along line I-I' of FIG. 1.

FIG. 1 is a perspective view of a light emitting diode package according to one embodiment of the present disclosure. FIG. 2 is a cross-sectional view of the light emitting diode package taken along line I-I' of FIG. 1.

A light emitting diode package 10 is a device configured to emit light and may be used as a light source for various apparatus, such as a sterilization apparatus, a deodorization apparatus, and the like. The light emitting diode package may be realized in the form of a chip-on-board (COB) or a surface-mounted-device (SMD).

According to one embodiment, the light emitting diode package 10 may include a main frame 100, a light emitting diode chip 200, a window 300, and a holding frame 400. Hereinafter, each of the components in the light emitting diode package 10 will be described in detail.

The main frame 100 constitutes a base of the light emitting diode package 10. The main frame 100 defines an overall appearance of the light emitting diode package 10 and may protect various components of the light emitting diode package 10 from an external environment.

The main frame 100 may include an open portion which is an empty space inside the main frame 100. Details of the open portion will be described below.

The main frame 100 may include a base frame 110 and a middle frame 120 disposed on the base frame 110.

First, the base frame 110 may be provided as a matrix of the light emitting diode package 10. Various components of the light emitting diode package 10 including the light emitting diode chip 200, the middle frame 120, and the like may be mounted on the base frame 110.

The base frame 110 may act as an electrode or may include a separate penetration electrode for supplying electrical signals and/or power to the light emitting diode chip 200.

When the base frame 110 acts as a conductor, the base frame 110 may be electrically connected to an external component. For example, the base frame 110 may be electrically connected to an external wire and/or an external power source. As a result, electrical signals and/or power may be supplied from an external power source to the light emitting diode chip 200 through the base frame 110.

When the base frame 110 is provided with the penetration electrode for supplying electrical signals and/or power to the light emitting diode chip 200, the penetration electrode of the base frame 110 may be electrically connected to an external wire and/or an external power source through a body of the base frame. In this structure, other portions of the base frame 110 excluding the penetration electrode may be electrically insulated.

When the base frame 110 acts as a matrix of the light emitting diode package 10 while acting as a conductor, the base frame 110 may include a material having high hardness and good thermal conductivity. For example, the base frame 110 may include at least one selected from among aluminum nitride (AlN), alumina ($Al_2O_3$), aluminum (Al), copper (Cu), gold (Au), silver (Ag), tungsten (W), zinc (Zn), nickel (Ni), iron (Fe), platinum (Pt), tin (Sn), chromium (Cr), oxides thereof, nitrides thereof, and alloys thereof.

The middle frame 120 is disposed on the base frame 110 and may be a raised portion extending from the base frame 110. Specifically, the middle frame 120 may extend from one surface of the base frame 110 in a height direction of the base frame 110.

The middle frame 120 may be disposed along the circumference of the base frame 110. For example, when the base frame 110 has a rectangular shape in a plan view, the middle frame 120 may be disposed along a rectangular circumference of the base frame 110.

The middle frame 120 may be physically coupled to the base frame 110. For example, the middle frame 120 may be coupled to the base frame 110 through a screw, a bonding agent, and the like.

The middle frame 120 may have a function of reflecting light emitted from the light emitting diode chip 200. Accordingly, light emitted from the light emitting diode chip 200 and not traveling towards the window 300 may be also reflected by the middle frame 120 and may be discharged from the light emitting diode package 10 through the window 300.

Like the base frame 110, the middle frame 120 may be manufactured of a material having relatively high hardness. For example, the middle frame 120 may include at least one selected from among aluminum nitride (AlN), alumina ($Al_2O_3$), aluminum (Al), copper (Cu), gold (Au), silver (Ag), tungsten (W), zinc (Zn), nickel (Ni), iron (Fe), platinum (Pt), tin (Sn), chromium (Cr), oxides thereof, nitrides thereof, and alloys thereof. Since the middle frame 120 may be electrically non-conductive, the middle frame 120 may be formed of various other materials. For example, the middle frame 120 may be manufactured using inorganic compounds, such as ceramic materials, silicon oxide, silicon nitride, and the like, and various plastic materials, such as polypropylene (PP), polyethylene (PE), polycarbonate (PC), polystyrene (PS), polyvinyl chloride (PVC), polyamide (PA), polyethylene terephthalate (PET), polybutylene terephthalate (PBT), poly(ethylene adipate) (PEA), poly(butylene succinate) (PBS), polyacetal, poly(phenylene oxide), ABS resin, melamine resin, urethane resin, fluorine resin, and the like.

The middle frame 120 has a middle frame upper surface 121, a middle frame lower surface 122, and a middle frame side surface 123. Here, the middle frame lower surface 122 may refer to a surface of the middle frame 120 adjoining the base frame 110 and the middle frame upper surface 121 may refer to a surface opposite to the middle frame lower surface 122. The middle frame side surface 123 may be a surface connecting the middle frame upper surface 121 to the middle frame lower surface 122. Particularly, the middle frame side surface 123 refers to an inner surface of the middle frame facing the light emitting diode chip 200 among inner and outer surfaces of the middle frame each connecting the middle frame upper surface 121 to the middle frame lower surface 122.

The middle frame side surface 123 may be a beveled surface having a certain gradient. Specifically, the middle frame side surface 123 may be formed to have an angle of 90° with respect to the middle frame lower surface 122.

The middle frame 120 may include a middle frame open portion 120h. The middle frame open portion 120h refers to a region in which the middle frame 120 is not disposed, and the base frame 110 may be partially exposed through the middle frame open portion 120h.

The middle frame open portion 120h may have a shape corresponding to a profile of the middle frame side surface 123. For example, as shown in the drawings, in a structure wherein the middle frame side surface 123 is inclined at an angle of 90° or less with respect to the middle frame lower surface 122, the middle frame open portion 120h may also have a cross-sectional area that gradually increases with increasing distance from the base frame 110.

With the structure of the middle frame open portion 120h having a cross-sectional area gradually increasing as s distance from the base frame 110 increases, as described above, light emitted from the light emitting diode chip 200 disposed on the base frame 110 may travel towards the window 300 without being obstructed by the middle frame 120. In some embodiments, the middle frame open portion has a tapered shape from the middle frame upper surface toward the middle frame lower surface.

In some embodiments, the middle frame 120 may be integrally formed with the base frame 110 or may be separately manufactured and attached thereto.

As shown in FIG. 2, the light emitting diode chip 200 is disposed inside the light emitting diode package 10 and emits light outside the light emitting diode package 10.

The light emitting diode chip 200 may be mounted on the base frame 110 and may be electrically connected to an external wire and/or an external power source through the base frame 110. For example, the light emitting diode chip 200 may be electrically connected to an external wire and/or an external power source through an interconnect portion formed on the base frame 110 or through the base frame 110.

The light emitting diode chip 200 is disposed inside the middle frame open portion 120h, as shown in FIG. 2. Thus, in a plan view, the middle frame 120 is not disposed in a region in which the light emitting diode chip 200 is placed. Accordingly, light emitted from the light emitting diode chip 200 is not blocked by the middle frame 120.

The light emitting diode chip 200 may be disposed at a place coaxial with the base frame 110 and the middle frame open portion 120h. Accordingly, the base frame 110 and the middle frame 120 may be symmetrical to each other with respect to the light emitting diode chip 200, as shown in FIG. 2. As the light emitting diode chip 200 is disposed at the place described above, the light emitting diode chip 200 may emit light evenly instead of allowing light to be biased in a particular direction.

The light emitting diode chip 200 may be selected from any types of light emitting diode chips. For example, a lateral chip, a vertical chip, a flip chip, and the like may be used as the light emitting diode chip 200. Further, the light emitting diode chip 200 may emit light in any wavelength band. For example, the light emitting diode chip 200 may emit light in a particular wavelength band, such as red light, blue light, or green light, in the visible spectrum, or may emit light in the UV or IR wavelength band.

The window 300 is disposed on the light emitting diode chip 200 and covers the open portion or the middle frame open portion 120h. With the structure where the window 300 covers the open portion or the middle frame open portion

120h, the light emitting diode chip 200 disposed inside the open portion or the middle frame open portion 120h may be protected from the outside.

The window 300 serves to protect the light emitting diode chip 200 from the outside while allowing light emitted from the light emitting diode chip 200 to be discharged from the light emitting diode package 10 therethrough.

The window 300 may transmit light emitted from the light emitting diode chip 200 while refracting the light. Accordingly, light emitted from the light emitting diode chip 200 may be focused on a particular region or may be dispersed at a broader irradiation angle. With the structure of the window 300, it is possible to increase or decrease the irradiation angle of light emitted from the light emitting diode package 10.

In order to increase or decrease the irradiation angle using the window 300 as described above, the window 300 may include a curved surface, as shown in FIGS. 1 and 2. For example, the window 300 may include a window lower surface 302 facing the light emitting diode chip, and a window upper surface 301 opposite to the window lower surface 302, in which the window upper surface 301 and/or the window lower surface 302 may have a predetermined curvature. Accordingly, the window 300 may be a spherical or elliptical ball type lens. Furthermore, in the window 300, the window upper surface 301 may be a curved surface and the window lower surface 302 may have a semi-spherical or semi-ellipsoid shape with a flat surface. Furthermore, for the window 300 having a curved surface on the window upper surface 301 and/or the window lower surface 302, the curved surface of the window 300 may have a variable curvature depending on a location thereof. Accordingly, the window 300 according to this embodiment may have multiple foci. Here, it should be understood that the window 300 is not limited thereto and may have a plate shape.

As shown in FIG. 2, the window 300 is spaced apart from the light emitting diode chip 200 in order to protect the light emitting diode chip 200. Accordingly, when the window 300 is exposed to impact, the impact applied to the window 300 is not directly transferred to the light emitting diode chip 200.

In order to dispose the window 300 to be spaced apart from the light emitting diode chip 200, the window 300 may be mounted on the middle frame 120, as shown in FIG. 2. For example, the window 300 may be mounted thereon such that the window lower surface 302 of the window 300 adjoins the middle frame 120. In this structure, a distance d1 from the middle frame upper surface 121 adjoining the window lower surface 302 to a distal end of the window lower surface 302 may be smaller than a distance h from an upper end of the light emitting diode chip 200 to the middle frame upper surface 121 (h>d1).

In order to dispose the window 300 to be spaced apart from the light emitting diode chip 200, the window 300 may have a maximum width w outside the middle frame open portion 120h. The maximum width w of the window 300 may be greater than a width 1 of the middle frame open portion 120h on the middle frame upper surface 121 adjoining the window 300 (w>1). For example, when the window 300 has an ellipsoid or semi-ellipsoid shape, a major axis of the window 300 may be placed outside the middle frame open portion 120h and may be greater than the width of the middle frame open portion 120h.

With the structure described above, when the window 300 adjoining the middle frame upper surface 121 is subjected to external force towards the light emitting diode chip 200, the window 300 is not pushed into the middle frame open portion 120*h*.

Furthermore, when the window 300 has the maximum width w outside the middle frame open portion 120*h*, a distance d2 from a distal end of the window upper surface 301 to the middle frame upper surface 121 may be greater than a distance d1 from the middle frame upper surface 121 to a distal end of the window lower surface 302, as shown in FIG. 2. Accordingly, a portion of the window 300 disposed outside the middle frame open portion 120*h* may have a larger surface area than a portion of the window 300 disposed inside the middle frame open portion 120*h*. Since light incident on the window 300 is discharged through a relatively large exit surface disposed outside the middle frame open portion 120*h*, the light can be discharged at a broader irradiation angle.

In some embodiments, the window 300 may be formed of a material which is optically transparent and has relatively high hardness in order to protect the light emitting diode chip 200 from the outside while transmitting light emitted from the light emitting diode chip 200 without light loss. For example, the window 300 may be formed of at least one selected from among glass, quartz, borosilicate (BSC), polycarbonate (PC), polyether sulfone, triacetylcellulose (TAC), poly(methyl methacrylate) (PMMA), polyvinyl alcohol (PVA), polyimide (PI), cyclic olefin copolymer (COC), Teflon®, and polytetrafluoroethylene (ePTFE), or a transparent polymer obtained as a mixture thereof. In particular, the window 300 may be formed of a material that transmits UV light without light loss.

The holding frame 400 is disposed on the middle frame 120 and holds the window 300, as shown in FIGS. 1 and 2. Specifically, the holding frame 400 adjoins the surface of the window 300 to hold the window 300 together with the middle frame 120.

More specifically, the holding frame 400 may include a holding frame lower surface 402 adjoining the middle frame 120, a holding frame upper surface 401 disposed at an opposite side of the holding frame lower surface, and a holding frame beveled surface 403 connecting the holding frame upper surface 401 to the holding frame lower surface 402.

The holding frame upper surface 401 may be substantially parallel to the holding frame lower surface 402, as shown in FIG. 2. In addition, since the holding frame lower surface 402 closely contacts the middle frame upper surface 121, the holding frame upper surface 401, the holding frame lower surface 402, and the middle frame upper surface 121 are substantially parallel to one another.

The holding frame upper surface 401 may have a larger area than the holding frame lower surface 402. Accordingly, as the distance from the light emitting diode chip 200 to the holding frame beveled surface 403 gradually increases, an opening defined by the holding frame beveled surface 403 in the holding frame 400 may have a gradually decreasing width, as shown in FIG. 2. In particular, a width 1' of the opening on the holding frame upper surface 401 is smaller than the maximum width w of the window 300 (w>1'). Accordingly, with the holding frame 400 disposed in the light emitting diode package 10, the window 300 is prevented from being pushed outwards from the light emitting diode package 10.

The holding frame lower surface 402 has a smaller area than the middle frame upper surface 121. That is, on a plane on which the holding frame 400 adjoins the middle frame 120, the middle frame 120 has a larger area than the holding frame 400. Accordingly, when the holding frame 400 is disposed on the middle frame 120, at least part of the middle frame upper surface 121 may be exposed instead of adjoining the holding frame 400.

With the structure wherein the holding frame lower surface 402 has a smaller area than the middle frame upper surface 121, the window 300 may be supported by both the holding frame 400 and the middle frame 120. Specifically, the window 300 may be provided to the light emitting diode package 10 so as to adjoin the holding frame beveled surface 403 while adjoining the middle frame upper surface 121 or the middle frame side surface 123.

As the distance from the holding frame lower surface 402 on which the middle frame 120 adjoins the holding frame 400 to the holding frame beveled surface 403 increases, the holding frame beveled surface 403 has an inclined shape towards the light emitting diode chip 300. Specifically, a gradient a1 between the holding frame beveled surface 403 and the holding frame upper surface 401 may be less than 90 degrees. Further, a holding frame open portion 403*h* defined by the holding frame beveled surface 403 may have a shape with an area gradually decreasing with increasing distance from the middle frame 120 or the main frame 100.

With the structure of the holding frame beveled surface 403 described above, the window 300 can be more stably secured to the light emitting diode package 10. In a cross-sectional view, the holding frame beveled surface 403 adjoins the window upper surface 301 at one point thereof and the window 300 can be stably secured thereto. Further, since the window 300 adjoins the holding frame beveled surface 403, which is a flat surface, there is no concern of damage to the window 300 by a sharp edge.

In the related art, a technique of bonding the window 300 to a frame is used in order to secure the window 300 to the light emitting diode package 10. However, for a ball type lens such as a spherical lens or an ellipsoidal lens, it may be difficult to secure a surface for bonding. Specifically, since a contact area between the ball type lens and the frame is relatively small, it may be difficult to secure the ball type lens to the frame by a typical method. Furthermore, since the ball type lens relatively easily rolls, the ball type lens can be easily displaced from an original location even by slight external force.

On the other hand, according to one embodiment, the holding frame 400 downwardly pushes the window 300 and the middle frame 120 upwardly supports the window 300, whereby the window 300 can be stably secured to the light emitting diode package 10 even without a bonding agent. In particular, since the holding frame beveled surface 403 is inclined at an acute angle with respect to the holding frame upper surface 401, the holding frame beveled surface 403 adjoins the window 300, whereby the window 300 can be stably secured to the light emitting diode package.

Figures 5A, 5B:
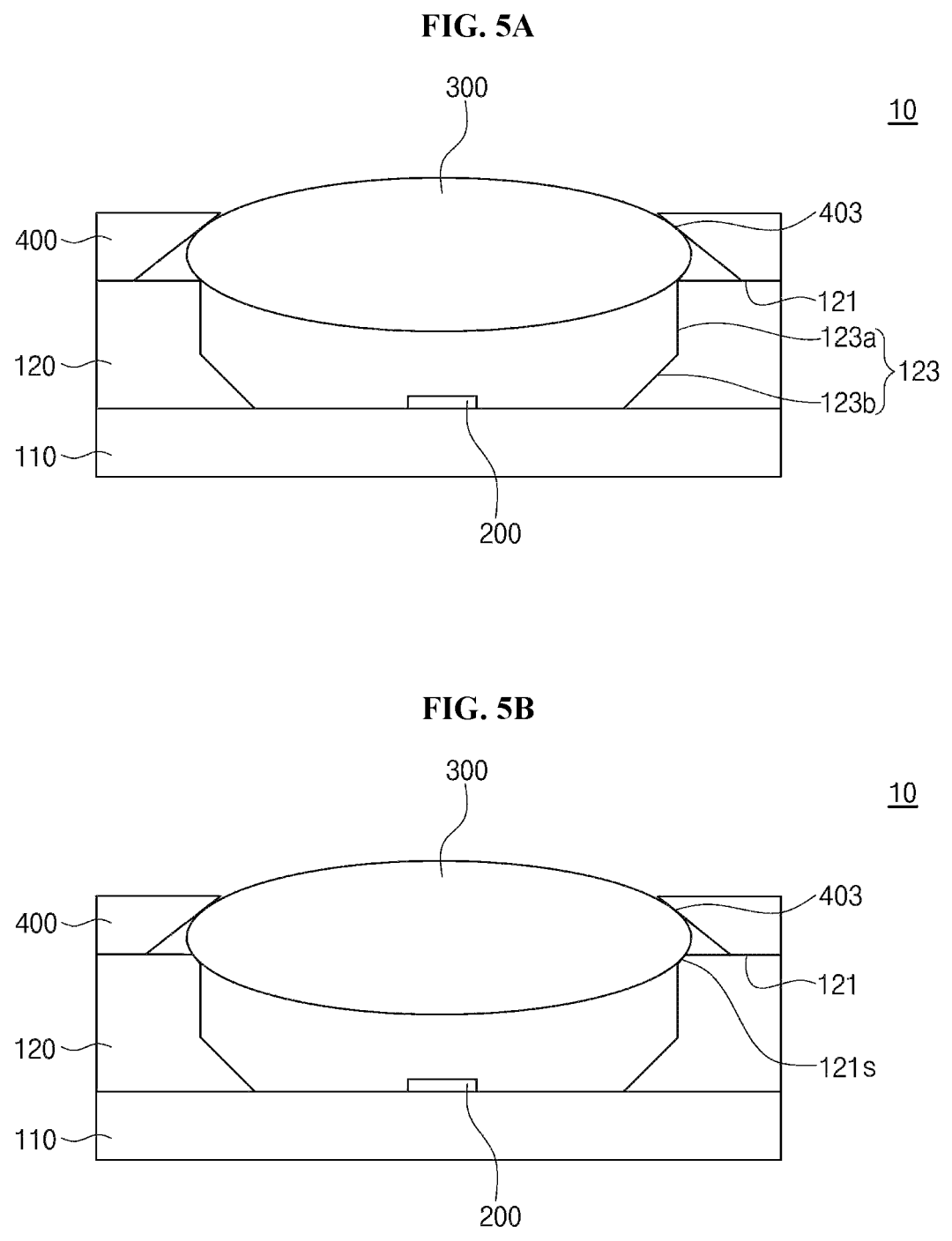
Figure 5C:
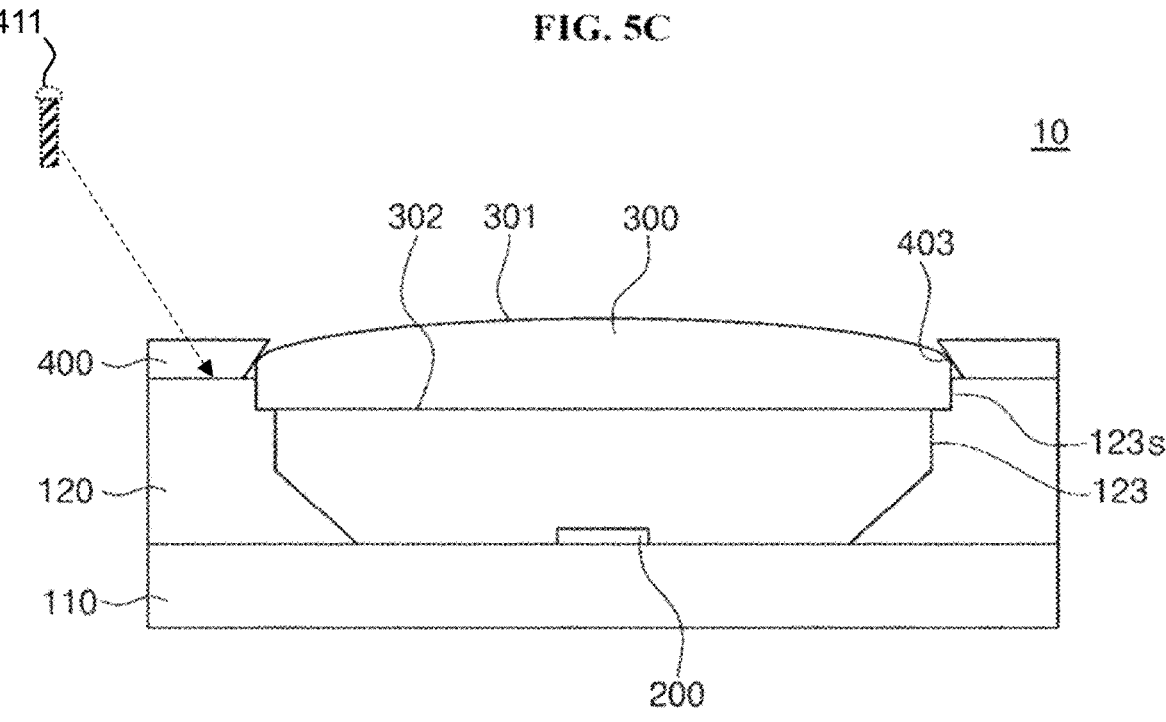
FIG. 5C is a sectional view of the light emitting diode package having a window having a different shape from a window shown in FIG. 5B.
Figure 5D:
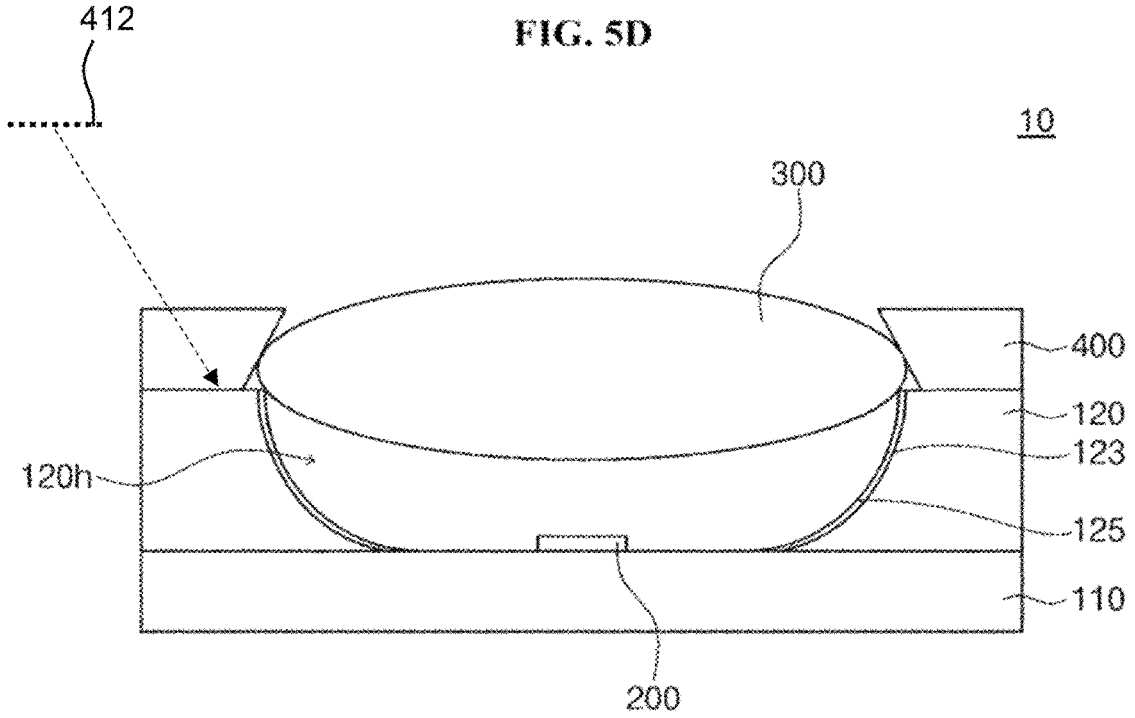
FIG. 5D is a sectional view of the light emitting diode package having a middle frame open portion having a different shape from a middle frame open portion shown in FIG. 5C.

Referring additionally to FIGS. 5C and 5D, in some embodiments, the holding frame 400 may be physically secured to the middle frame 120. For example, the holding frame 400 may be screw-coupled 411 to the middle frame 120 or bonded thereto through a bonding layer 412. Since the holding frame 400 is physically secured to the middle frame 120, the holding frame 400 can be separated from the middle frame 120, as needed. Accordingly, upon replacement of the window 300 or the light emitting diode chip 200, the holding frame 400 holding the window 300 is separated from the middle frame 120, thereby enabling easy replacement of and the window 300 or the light emitting diode chip 200.

The holding frame 400 may be manufactured using a material having high hardness in order to hold the window 300 while protecting the window 300. For example, the holding frame 400 may be manufactured using various metals, inorganic compounds, such as a ceramic material, silicon oxide, and silicon nitride, and various plastic materials, such as polypropylene (PP), polyethylene (PE), polycarbonate (PC), polystyrene (PS), polyvinyl chloride (PVC), polyamide (PA), polyethylene terephthalate (PET), polybutylene terephthalate (PBT), poly(ethylene adipate) (PEA), poly(butylene succinate) (PBS), polyacetal, poly(phenylene oxide), ABS resin, melamine resin, urethane resin, fluorine resin, and the like.

In some embodiments, the window 300 is secured by the holding frame 400 and the middle frame 120. In particular, since the window 300 is secured by a flat beveled surface of the holding frame 400, there is no concern of damage to the window 300 by a sharp edge and the window 300 can be structurally stably secured. Thus, even a ball type lens not allowing attachment through bonding can be stably mounted on the light emitting diode package 10.

Figure 3A:
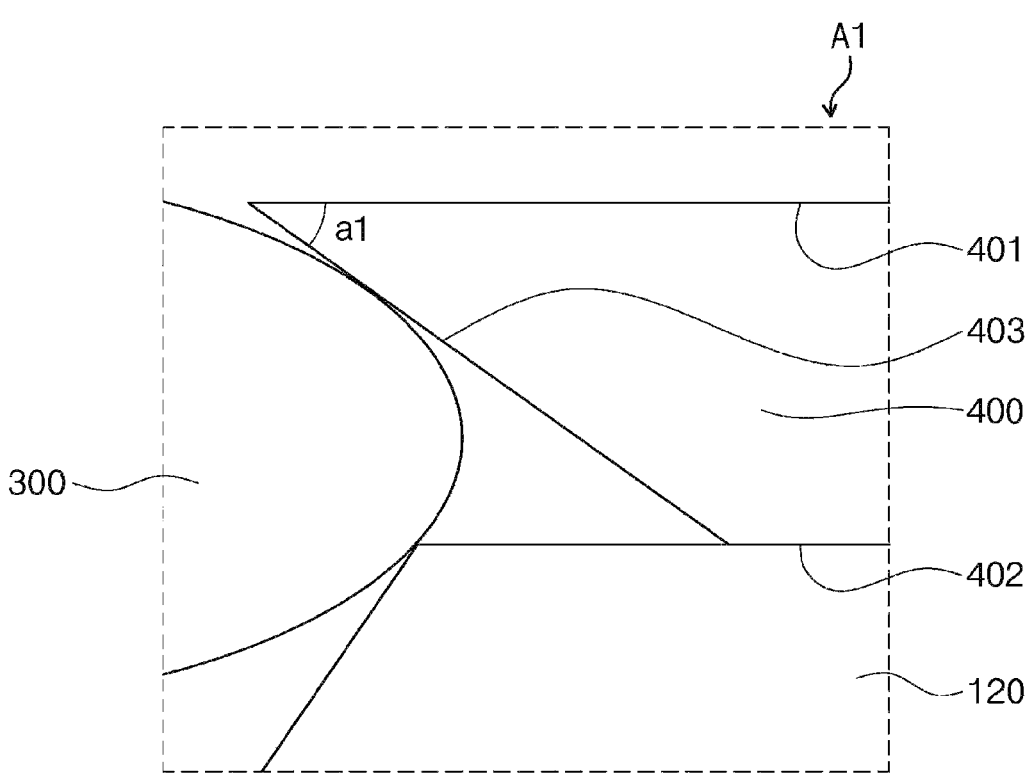
FIG. 3A is an enlarged cross-sectional view of Region A1 of FIG. 2.
Figure 3B:
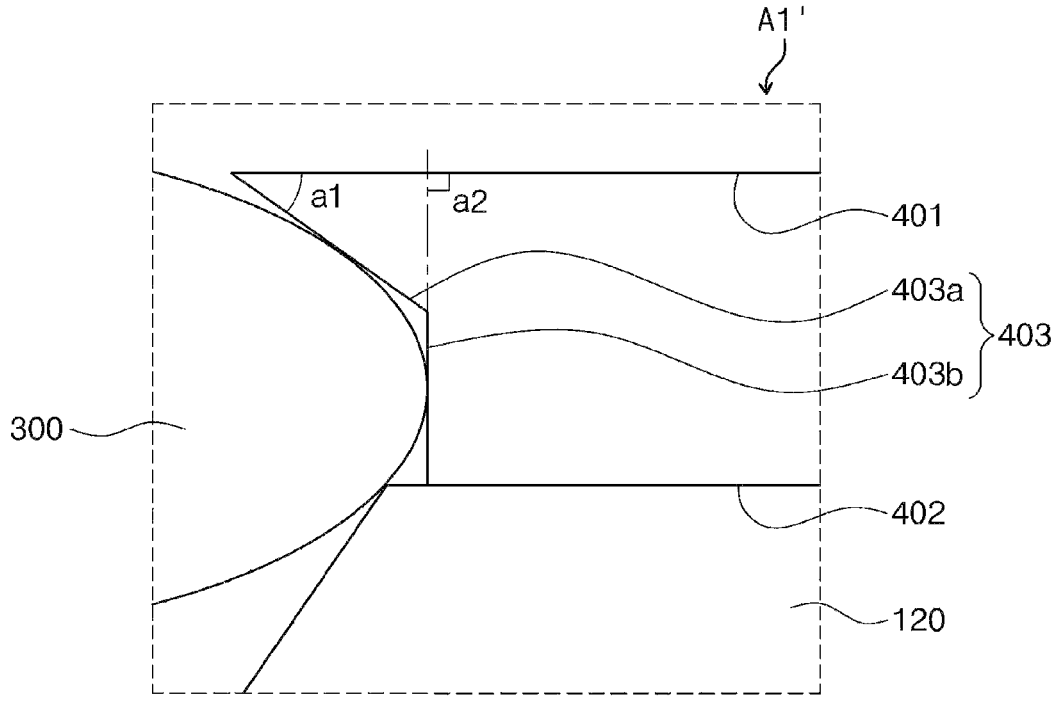
FIG. 3B is a cross-sectional view of modifications of Region A1 of FIG. 3A.
Figure 3C:
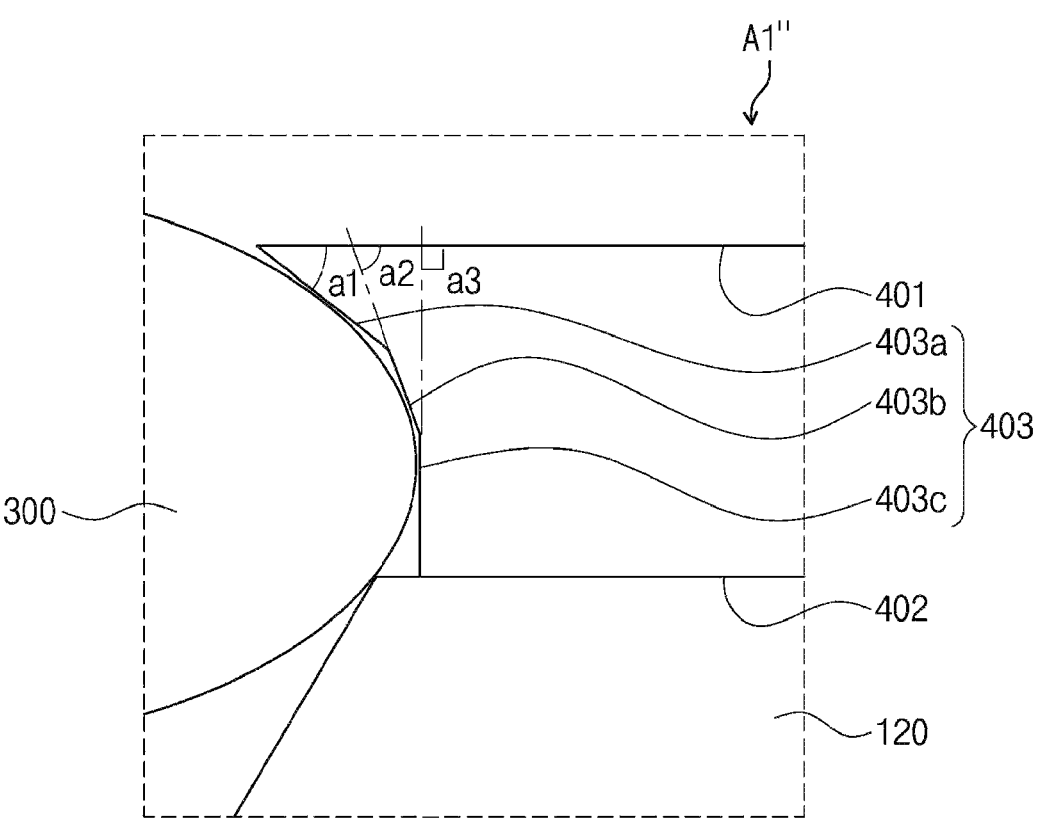
FIG. 3C is a cross-sectional view of modifications of Region A1" of FIG. 3A.

Next, the shape of the holding frame 400 enabling stable holding will be described in more detail. FIG. 3A is an enlarged cross-sectional view of Region A1 of FIG. 2 and FIG. 3B and FIG. 3C are cross-sectional views of modifications of Region A1 of FIG. 2.

Referring to FIG. 3A, the window 300 having a curved surface is secured by the middle frame 120 and the holding frame 400.

As described above, the holding frame 400 includes the holding frame beveled surface 403 and the holding frame upper surface 401, which define an inclined angle a1 of less than 90 degrees therebetween. Further, the holding frame beveled surface 403 adjoins the window 300 at one point thereof when viewed in a cross-sectional view.

Here, since the holding frame 400 is disposed along an outer circumferential surface of the window 300, contact points between the holding frame 400 and the window 300 may constitute a circle or an ellipse similar to a planar shape of the window 300 when the window 300 has a circular shape or an elliptical shape in plan view.

Referring to FIG. 3B, the holding frame beveled surface 403 includes multiple beveled surfaces having different gradients. Specifically, the holding frame beveled surface 403 may include a first holding frame beveled surface 403a and a second holding frame beveled surface 403b, which are connected to each other. Accordingly, the holding frame 400 may have a shape in which the holding frame upper surface 401, the first holding frame beveled surface 403a, the second holding frame beveled surface 403b, and the holding frame lower surface 402 are sequentially connected to one another.

As shown in FIG. 3B, the first holding frame beveled surface 403a and the second holding frame beveled surface 403b adjoin the window 300 at different locations. Here, a first inclined angle a1 defined between the first holding frame beveled surface 403a and the holding frame upper surface 401 may be different from a second inclined angle a2 defined between an extension line of the second holding frame beveled surface 403b and the holding frame upper surface 401. Specifically, the holding frame beveled surface 403 may be formed such that the first inclined angle a1 is greater than the second inclined angle a2. For example, the holding frame beveled surface 403 is formed such that the first inclined angle a1 is less than 90 degrees and the second inclined angle a2 is 90 degrees.

With the structure of the holding frame beveled surface 403 described above, the holding frame 400 may hold and secure the window 300 in various ways. For example, the second holding frame beveled surface 403b perpendicular to the holding frame lower surface 402 may hold the window 300 so as not to move in a horizontal direction.

Further, the holding frame beveled surface 403 may adjoin the window 300 at a greater number of contact points therebetween, thereby enabling distribution of stress applied to the window 300 through the contact points. As a result, a possibility of damage to the window 300 by the holding frame 400 may be further reduced.

FIG. 3C illustrates one variation of the holding frame beveled surface 430. Referring to FIG. 3C, the holding frame beveled surface 403 includes multiple beveled surfaces. Specifically, the holding frame beveled surface 403 includes a first holding frame beveled surface 403a, a second holding frame beveled surface 403b, and a third holding frame beveled surface 403c.

The first to third holding frame beveled surfaces 403a, 403b, 403c may be formed to have different inclined angles with respect to the holding frame upper surface 401. For example, the first holding frame beveled surface 403a and the holding frame upper surface 401 may define a first inclined angle a1 therebetween, an extension line of the second holding frame beveled surface 403b and the holding frame upper surface 401 may define a second inclined angle a2 therebetween, and an extension line of the third holding frame beveled surface 403c and the holding frame upper surface 401 may define a third inclined angle a3. The first to third inclined angles may satisfy Relation: a3>a2>a1. Accordingly, the first to third holding frame beveled surfaces 403a, 403b, 403c may be connected corresponding to a radius of curvature of the curved surface of the window 300.

Each of the first to third holding frame beveled surfaces 403a, 403b, 403c may adjoin the window 300 at each different contact point. The holding frame beveled surface 403 may adjoin the window 300 at a greater number of contact points therebetween, thereby enabling distribution of stress applied to the window 300 through the contact points. As a result, a possibility of damage to the window 300 by the holding frame 400 may be further reduced.

In some embodiments, the holding frame beveled surface 403 may include multiple beveled surfaces having different inclined angles. Among the multiple beveled surfaces, at least one beveled surface may be inclined at an acute angle with respect to the holding frame upper surface 401. As a result, the holding frame 400 may hold the window 300 so as to prevent the window 300 from being separated upwardly. Furthermore, among the multiple beveled surfaces, any one beveled surface may be perpendicular to the holding frame lower surface 402 so as to prevent the window 300 from moving in a lateral direction. Furthermore, the multiple beveled surfaces of the holding frame beveled surface 403 allow the window 300 to adjoin the holding frame beveled surface 403 at multiple contact points, thereby enabling distribution of stress applied to the window 300 by the holding frame beveled surface 403.

In the above embodiments, various shapes of the holding frame configured to hold the window having an ellipsoid shape have been described. However, it should be understood that the shape of the holding frame may be applied to different types of windows having other shapes instead of the ellipsoid shape. The window may have various shapes as well as the ellipsoid shape. In the following description, different shapes of the window will be described.

Figure 4:
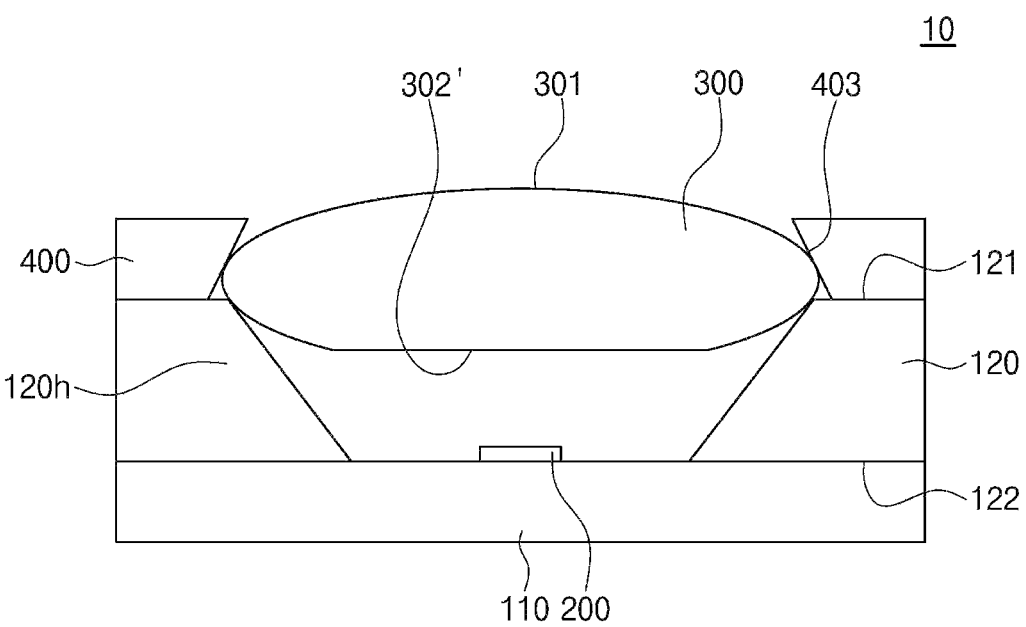
FIG. 4 is a sectional view of the light emitting diode package according to the embodiment of the present disclosure.

FIG. 4 is a sectional view of the light emitting diode package according to the embodiment of the present disclosure. Referring to FIG. 4, the window upper surface 301 is a curved surface and the window lower surface 302' is a flat surface.

With the above structure of the window 300, light emitted from the light emitting diode chip 200 enters the window lower surface 302', which is a flat surface, and is refracted by the window upper surface 301. The curved surface of the window upper surface 301 may have a curvature enabling diversion or collection of the light.

The window lower surface 302' having a flat surface is less likely to contact the light emitting diode chip 200 than the window lower surface 302 having a curved surface. With this structure, the window 300 can be placed closer to the light emitting diode chip 200. As a result, most light emitted from the light emitting diode chip 200 can directly enter the window 300. Accordingly, with the above structure of the window lower surface 302', most light emitted from the light emitting diode chip 200 may be directly discharged from the light emitting diode package 10 through the window 300 instead of traveling towards other components of the light emitting diode package 10. Accordingly, the quantity of light emitted from the light emitting diode package 10 can be increased.

In the above embodiments, the windows having various shapes other than a spherical or ellipsoidal shape have been described. However, it should be understood that the window may have various shapes other than the above shapes. Next, various shapes of the middle frame will be described.

FIG. 5A to FIG. 5D are sectional views of the light emitting diode package according to one or more embodiments of the present disclosure.

Referring to FIG. 5A, the middle frame 120 may include a first middle frame side surface 123a and a second middle frame side surface 123b, which have different gradients.

With the above structure of the middle frame side surface 123, the middle frame 120 may have a shape in which the middle frame lower surface 122, the second middle frame side surface 123b, the first middle frame side surface 123a, and the middle frame upper surface 121 are continuously connected to one another.

As the middle frame side surface 123 includes the first middle frame side surface 123a and the second middle frame side surface 123b having different gradients, the shape of the middle frame open portion 120h may be changed, as shown in FIG. 5A. Specifically, the shape of the middle frame open portion 120h may differ depending upon the gradients of the first middle frame side surface 123a and the second middle frame side surface 123b. As described in the different embodiments above, the middle frame open portion 120h may have different structures in the different embodiments.

The second middle frame side surface 123b may have a gradient in the form of a conical shape gradually spreading from the base frame 110 and the middle frame open portion 120h may also have a cross-sectional area gradually increasing with increasing distance from the base frame 110, as shown in FIG. 5A. Furthermore, the first middle frame side surface 123a, which starts from one end of the second middle frame side surface 123b, may be perpendicular to the base frame 110 and the middle frame open portion 120h may have a constant cross-sectional area on the first middle frame side surface 123a, regardless the distance from the base frame 110.

Referring to FIG. 5B, the middle frame 120 further includes a middle frame beveled surface 121s inclined from the middle frame upper surface 121 corresponding to surface curvature of the window 300. The middle frame beveled surface 121s adjoins the curved surface of the window 300.

Accordingly, in a cross-sectional view, the window 300 has a contact point with the holding frame beveled surface 403 and a contact point with the middle frame beveled surface 121s. As the window 300 adjoins the middle frame beveled surface 121s, which is a flat surface, there may be less concern of damage to the window due to an edge of the middle frame 120.

The middle frame beveled surface 121s may have a gradient depending upon the curvature of the window 300. Furthermore, the middle frame beveled surface 121s may include multiple beveled surfaces having different gradients.

FIG. 5C illustrates the light emitting diode package 10 having a window having a different shape from the window described in other embodiments. Referring to FIG. 5C, the window 300 may have a structure in which the window upper surface 301 is a curved surface and the window lower surface 302 is a flat surface. Specifically, the window 300 may have a rectangular parallelepiped shape having one curved facet.

With the above structure of the window 300, the window lower surface 302 may have a perpendicular edge. To secure the window 300 having the above shape, the middle frame 120 may have a middle frame step 123s at one side thereof. The middle frame step 123s is provided in the form of a stair and may closely contact the perpendicular edge of the window lower surface 302.

The middle frame step 123s secures the window so as to prevent the window from moving in the downward direction (towards the light emitting diode chip 200) or in the lateral direction. Further, the holding frame 400 disposed on the middle frame 120 secures the window 300 so as to prevent the window 300 from moving in the upward direction. Accordingly, the window 300 including the window lower surface 302 having a perpendicular edge can be stably secured to the light emitting diode package 10.

FIG. 5D illustrates the light emitting diode package 10 having a middle frame open portion having a different shape from those described in other embodiments. Referring to FIG. 5D, the middle frame side surface 123 has a parabolic shape.

When the middle frame side surface 123 has a parabolic shape, the middle frame open portion 120h may have a cross-sectional area depending upon the distance from the base frame 110. Furthermore, the middle frame open portion 120h may have a cross-sectional area gradually increasing with increasing distance from the base frame 110, whereby the area of the middle frame open portion 120h on the middle frame lower surface 122 may be smaller than the area of the middle frame open portion 120h on the middle frame upper surface 121.

As the middle frame open portion 120h has a cross-sectional area gradually increasing with increasing distance from the light emitting diode chip 200, light emitted from the light emitting diode chip 200 can be discharged from the light emitting diode package 10 through the window 300 without being blocked by the middle frame 120.

According to one embodiment, the light emitting diode package 10 may further include a reflective layer 125 formed on the middle frame side surface 123, as shown in FIG. 5D.

The reflective layer 125 reflects light, which is emitted from the light emitting diode chip 200 and travels towards the middle frame 120, towards the window 300. In particular, when the middle frame side surface 123 has a parabolic shape as described above, the parabolic shape of the middle frame side surface 123 has a focal point at a place where the window 300 is disposed. Accordingly, light having reached the middle frame side surface 123 may be reflected by the reflective layer 125 to be collected on the window 300 where the focal point of the parabolic shape is placed.

Thus, according to the embodiment, the reflective layer 125 is disposed on the middle frame side surface 123 having a parabolic shape, thereby allowing all fractions of light emitted from the light emitting diode chip 200 to be discharged from the light emitting diode package 10.

In the above-described embodiments, the light emitting diode package 10 including a single light emitting diode chip 200, a single middle frame open portion 120*h*, and a single window 300 has been described. However, in other embodiments, one light emitting diode package 10 may include multiple light emitting diode chips, multiple middle frame open portions, and multiple windows. In addition, in the above-described embodiments, the same component is identified with the same reference numeral, but the present disclosure is not limited to the same component having the same or single structure. In other words, in different embodiments, the same component may have different structures and shapes based on modifications and/or need.

Figure 6A:
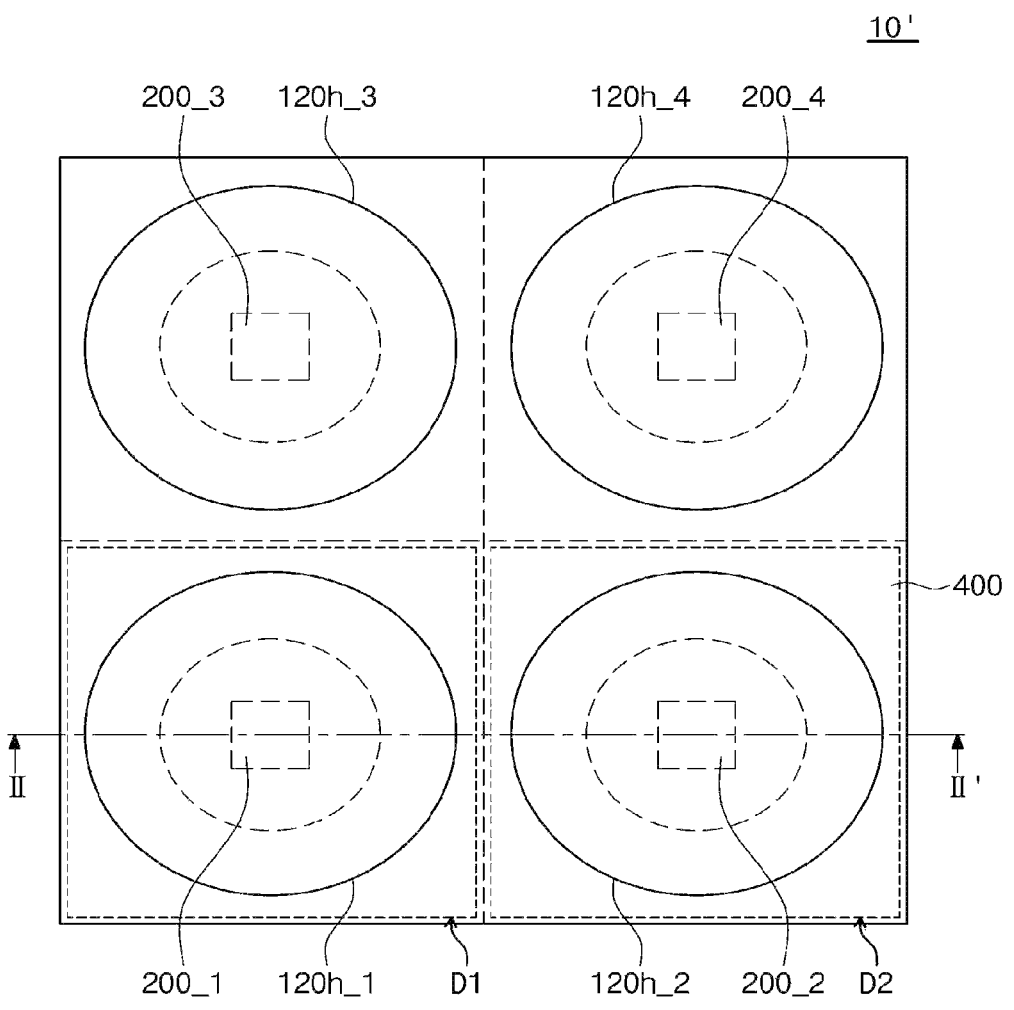
FIG. 6A is a plan view of a light emitting diode package according to one embodiment of the present disclosure.
Figure 6B:
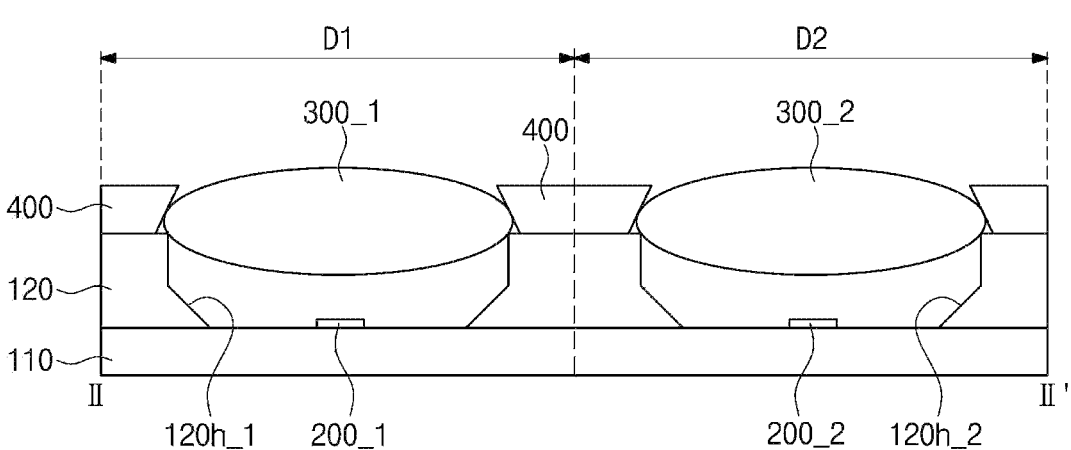
FIG. 6B is a cross-sectional view taken along line II-IP of FIG. 6A.

FIG. 6A is a plan view of a light emitting diode package 10' according to one embodiment of the present disclosure and FIG. 6B is a cross-sectional view taken along line of FIG. 6A.

Referring to FIG. 6A and FIG. 6B, a light emitting diode package 10' according to one embodiment may include multiple open portions and multiple light emitting diode chips. Since the multiple open portions included in the main frame are substantially the same as the multiple middle frame open portions, the open portions will be referred to as the middle frame open portions in the following description.

The light emitting diode package 10' may include first to fourth light emitting diode chips 200_1 to 200_4 on the same plane. The first to fourth light emitting diode chips 200_1 to 200_4 may be provided to first to fourth middle frame open portions 120*h*_1 to 120*h*_4, respectively. Furthermore, the first to fourth middle frame open portions 120*h*_1 to 120*h*_4 may be covered by independent windows, respectively.

The first to fourth middle frame open portions 120*h*_1 to 120*h*_4 may be arranged in a matrix. Accordingly, the first to fourth light emitting diode chips 200_1 to 200_4 disposed in the first to fourth middle frame open portions 120*h*_1 to 120*h*_4 may also be arranged in a matrix.

Each of the first to fourth middle frame open portions 120*h*_1 to 120*h*_4 and each of the first to fourth light emitting diode chips 200_1 to 200_4 may be disposed in each independent light source zone. For example, the first middle frame open portion 120*h*_1 and the first light emitting diode chip 200_1 may be disposed in a first light source zone D1, and the second middle frame open portion 120*h*_2 and the second light emitting diode chip 200_2 may be disposed in a second light source zone D2.

As shown in FIG. 6B, the first light source zone D1 may be provided with a first window 300_1 and the second light source zone D2 may be provided with a second window 300_2. The first window 300_1 and the second window 300_2 may be secured together by a single holding frame 400.

The holding frame 400 may be a rectangular parallelepiped structure having four openings corresponding to the first to fourth middle frame open portions 120*h*_1 to 120*h*_4. The holding frame 400 may be coupled to the middle frame 120 having the first to fourth middle frame open portions 120*h*_1 to 120*h*_4, thereby simultaneously securing four windows including the first window 300_1 and the second window 300_2.

As described above, the light emitting diode package 10' may include the first to fourth middle frame open portions 120*h*_1 to 120*h*_4 and the first to fourth light emitting diode chips 200_1 to 200_4. As the light emitting diode package 10' includes multiple middle frame open portions and multiple light emitting diode chips, the light emitting diode package 10' may be cut along the light source zones, thereby providing independent multiple light emitting diode packages 10', as needed. For example, the light emitting diode chip 200_1 disposed in the first light source zone D1 and the light emitting diode chip 200_2 disposed in the second light source zone D2 may be provided to a single light emitting diode package 10' or may be divided and provided to separate light emitting diode packages.

The number of light emitting diode chips and the number of middle frame open portions in the light emitting diode package 10' may be changed in different ways from those described above.

According to some embodiments, a light emitting apparatus using the light emitting diode packages described above may be provided. There is no limit as to the kind of light emitting apparatus. For example, the light emitting apparatus may be a UV curing apparatus, a sterilization apparatus, and the like.

The light emitting apparatus may include at least one of the light emitting diode packages described above and may include a main body on which the light emitting diode package is mounted. The main body may include a power source for supplying power to the light emitting diode package, a controller controlling the quantity of light emitted from the light emitting diode package, and the like.

Figure 7:
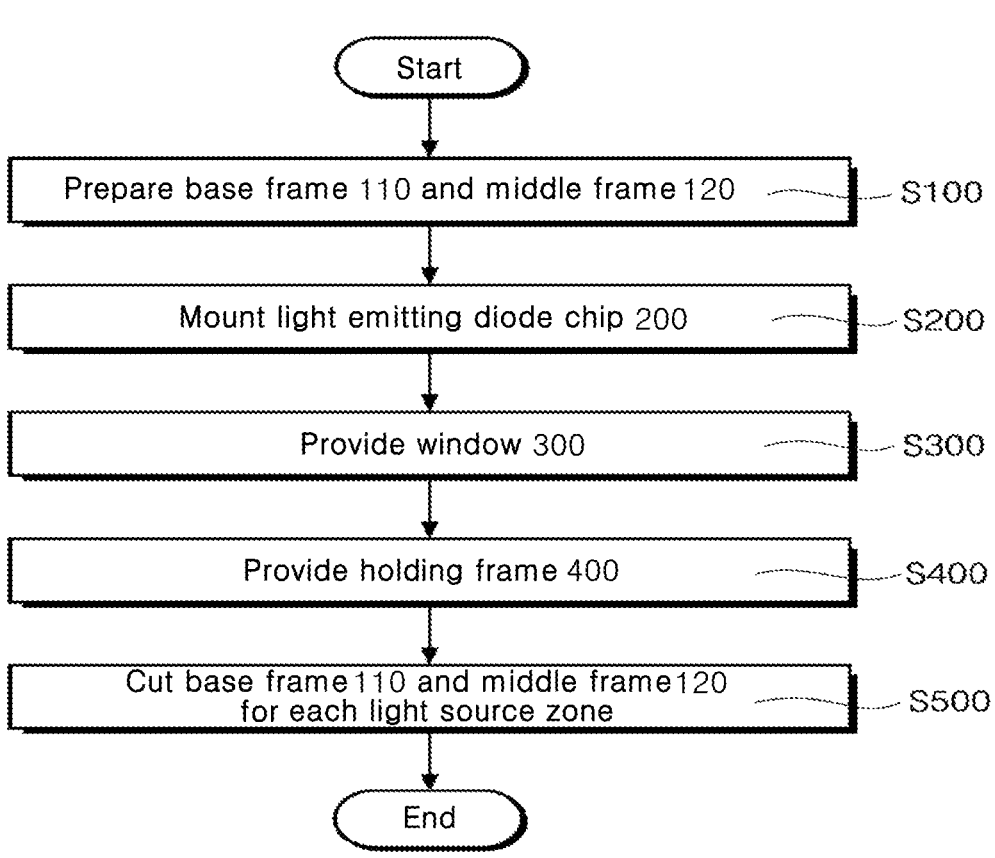
FIG. 7 is a flowchart illustrating a method of manufacturing a light emitting diode package according to one embodiment of the present disclosure.

FIG. 7 is a flowchart illustrating a method of manufacturing a light emitting diode package according to one embodiment of the present disclosure.

Referring to FIG. 7, for manufacture of the light emitting diode package, first, a base frame and a middle frame are prepared (S100). When the base frame and the middle frame are separately provided, the middle frame and the base frame may be provided in the form of an assembly. If these two components are provided as an integrated structure, the main frame including the base frame and the middle frame may be directly provided.

The size of the base frame may be changed depending upon the number of light emitting diode chips to be mounted on the base frame. For mounting a number of light emitting diode chips on the base frame, a relatively large base frame may be prepared.

Next, one or more light emitting diode chips are mounted on the base frame (S200). When the base frame has electrical conductivity and is divided into two parts by an insulating layer, the light emitting diode chips are mounted on the base frame such that each of the pads of the light emitting diode chips meets each of the parts of the base frame divided by the insulating layer. Upon mounting the multiple light emitting diode chips on the base frame, the multiple light emitting diode chips are disposed such that one middle frame open portion is provided with one light emitting diode chip.

Next, a window is disposed on each of the open portions or the middle frame open portions (S300). The number of windows may be the same as the number of middle frame open portions. The windows provided to the open portions or the middle frame open portions may be provided in different ways. Accordingly, the window may be provided in the form of spherical lenses to some open portions and in the form of ellipsoidal lenses.

Next, a holding frame is disposed on the middle frame (S400). The holding frame may be physically coupled to the middle frame. As the holding frame is coupled to the middle frame, the windows may be secured between the holding frame and the middle frame.

Next, the frames are cut for each light source zone (S500). The light source zone may be an independent zone in which one light emitting diode chip, one opening, and one window are disposed. By cutting the frames for each light source zone, independent light emitting diode packages may be manufactured corresponding to the number of light source zones.

As such, the multiple light emitting diode packages may be manufactured at the same time by the method described above and each of the light emitting diode packages may include windows having different shapes or different kinds of light emitting diode chips. Accordingly, the multiple light emitting diode packages having different characteristics can be easily manufactured at the same time using the manufacturing method according to the embodiment of the present disclosure.

The method illustrated in FIG. 7 includes the method for manufacturing the light emitting diode package 10, 10' in the above-described embodiments. Steps (S100, S200, S300, S400, S500) include steps for preparing, providing and/or mounting the base frame 110, the middle frame 120, the light emitting diode chip 200, the holding frame 400, the window 300 included in the light emitting diode package 10, 10' in the above-described embodiments.

Although some embodiments have been described herein, it should be understood that the present disclosure is not limited to these embodiments and that various modifications, variations, and alterations can be made by those skilled in the art without departing from the spirit and scope of the present disclosure. In addition, although advantageous effects resulting from the configuration of the present disclosure are not explicitly described in description of the embodiments of the present disclosure, it is apparent that predictable effects by the corresponding configuration should also be recognized.

What is claimed is:

1. A light emitting apparatus comprising:
one or more light emitting diode packages, at least one light emitting diode package comprising:
a main frame comprising a base frame and a middle frame disposed on the base frame;
a holding frame secured to the middle frame;
a coupler that physically couples the holding frame to the middle frame;
a light emitting diode chip disposed on the base frame; and
a window secured by the main frame and the holding frame, wherein the window includes an upper window surface having a curvature opposite the base frame, a vertical flat surface, and a lower flat surface opposite the upper window surface,
wherein:
the middle frame comprises an uppermost surface and a middle frame open portion exposing the light emitting diode chip;
the middle frame open portion has an upper opening at the uppermost surface that is farthest from the base frame,
the holding frame comprises a holding frame open portion exposing the middle frame open portion and the light emitting diode chip, a lowermost surface adjoined to the uppermost surface of the middle frame, and an uppermost surface that is farthest from the main frame;

the holding frame open portion having a lower opening at the lowermost surface of the holding frame and an upper opening at the uppermost surface of the holding frame;
the holding frame comprises a holding frame beveled surface between the bottommost surface of the holding frame and the uppermost surface of the holding frame and the beveled surface forms an acute included angle with the uppermost surface of the holding frame;
the holding frame beveled surface is inclined towards the light emitting diode chip from a plane of the uppermost surface of the holding frame;
an area of the lower opening of the holding frame is greater than an area of the upper opening of the holding frame and is greater than an area of the upper opening of the middle frame; and
an area of the uppermost surface of the middle frame is larger than an area of the lowermost surface of the holding frame.

2. The light emitting apparatus according to claim 1, wherein the holding frame open region has an area gradually decreasing as a distance from the main frame increases.

3. The light emitting apparatus according to claim 1, wherein the middle frame comprises: a middle frame lower surface on which the middle frame adjoins the base frame and at which the middle frame is in contact with the base frame; and a middle frame step below the uppermost surface of the middle frame, and wherein the middle frame open region has a smaller area at the middle frame lower surface than at the uppermost surface of the middle frame.

4. A light emitting diode package comprising:
a main frame comprising a base frame and a middle frame disposed on the base frame;
a holding frame disposed on the middle frame;
a coupler that physically couples the holding frame to the middle frame;
a light emitting diode chip disposed on the base frame; and
a window secured by the main frame and the holding frame,
wherein the middle frame comprises an uppermost surface and a middle frame open portion exposing the light emitting diode chip,
wherein the middle frame open portion has an upper opening at the uppermost surface that is farthest from the base frame,
wherein the holding frame comprises a holding frame open portion exposing the middle frame open portion and the light emitting diode chip, a lowermost surface adjoined to the uppermost surface of the middle frame, and an uppermost surface that is farthest from the main frame,
wherein the holding frame open portion has a lower opening at the lowermost surface of the holding frame and an upper opening at the uppermost surface of the holding frame and the holding frame open portion has an area gradually decreasing as a distance from the main frame increases,
wherein an area of the lower opening of the holding frame is greater than an area of the upper opening of the holding frame and is greater than an area of the upper opening of the middle frame open portion,
wherein a width of the upper opening region of the holding frame is less than a maximum width of the window, wherein the window includes an upper window curved surface opposite the base frame, a flat vertical surface, and a flat lower surface facing the base frame;

wherein the middle frame includes a middle frame step below the uppermost surface of the middle frame, and the middle frame step is formed of a horizontal surface and a vertical surface in contact with the horizontal surface, wherein the horizontal surface directly contacts the flat lower surface respectively, of the window; and wherein the holding frame comprises a beveled surface between the bottommost surface of the holding frame and the uppermost surface of the holding frame, the beveled surface forms an acute included angle with the uppermost surface of the holding frame and includes at least two different inclined angles.

5. The light emitting diode package according to claim 4, wherein the uppermost surface of the middle frame has a first area and the lowermost surface of the holding frame has a second area, and the first area is larger than the second area.

6. The light emitting diode package according to claim 4, wherein the main frame is integrally formed with the base frame.

7. The light emitting diode package according to claim 4, wherein the middle frame open portion is one of multiple middle frame open portions disposed adjacent each other on a same plane;

wherein the light emitting diode chip is one of multiple light emitting diode chips disposed exposed through a corresponding one of the multiple middle frame open regions; and wherein the window is one of multiple windows covering a corresponding one of the middle frame open portions, wherein the holding frame is one of multiple holding frames securing a corresponding one of the multiple windows.

8. The light emitting diode package according to claim 4, wherein the beveled surface of the holding frame is inclined towards the light emitting diode chip from a plane of the uppermost surface of the holding frame.

9. The light emitting diode package according to claim 4, wherein the at least two different inclined angles is less than 90 degrees, the angles defined between the uppermost surface of the holding and the beveled surface.

10. The light emitting diode package according to claim 9, wherein an area of the uppermost surface of the holding frame is larger than an area of the holding frame lowermost surface.

11. The light emitting diode package according to claim 4, wherein the middle frame open portion has a tapered shape.

12. The light emitting diode package according to claim 11, wherein the window has a maximum width at the middle frame step.

13. The light emitting diode package according to claim 11, wherein the window has a semi-ellipsoid shape and a maximum diameter of the window is at the middle frame step.

14. The light emitting diode package according to claim 11, wherein a distance from a distal end of the upper window curved surface to the uppermost surface of the middle frame upper surface is greater than a distance from the uppermost surface of the middle frame the flat lower surface of the window.

15. The light emitting diode package according to claim 14, wherein the distance from the uppermost surface of the middle frame to the flat lower surface of the window is smaller than a distance from an upper end of the light emitting diode chip to the uppermost surface of the middle frame.

16. A method of manufacturing a light emitting diode package, comprising:

providing a main frame comprising a base frame and a middle frame disposed on the base frame;

providing a holding frame disposed on the middle frame;

providing a coupler that physically couples the holding frame to the middle frame;

disposing a light emitting diode chip on the base frame; and providing a window secured by the main frame and the holding frame, wherein the middle frame comprises an uppermost surface and a middle frame open portion exposing the light emitting diode chip, wherein the middle frame open portion has an upper opening at the uppermost surface that is farthest from the base frame, wherein the holding frame comprises a holding frame open portion exposing the middle frame open portion and the light emitting diode chip, a lowermost surface adjoined to the uppermost surface of the middle frame, and an uppermost surface that is farthest from the main frame, wherein the holding frame open portion has a lower opening at the lowermost surface of the holding frame and an upper opening at the uppermost surface of the holding frame and the holding frame open portion has an area gradually decreasing as a distance from the main frame increases, wherein an area of the lower opening of the holding frame is greater than an area of the upper opening of the holding frame and is greater than an area of the upper opening of the middle frame open portion, wherein a width of the upper opening of the holding frame is less than a maximum width of the window, wherein the window includes an upper window curved surface opposite the base frame, a flat vertical surface, and a flat lower surface facing the base frame;

wherein the middle frame includes a middle frame step below the uppermost surface of the middle frame, and the middle frame step is formed of a horizontal surface and a vertical surface in contact with the horizontal surface, wherein the horizontal surface directly contacts the flat lower surface of the window; and wherein the holding frame comprises a beveled surface between the bottommost surface of the holding frame and the uppermost surface of the holding frame, the beveled surface forms an acute included angle with the uppermost surface of the holding frame and includes at least two different inclined angles.

* * * * *